United States Patent [19]
Hwang

[11] Patent Number: 6,156,583
[45] Date of Patent: Dec. 5, 2000

[54] METHOD FOR MANUFACTURING A LIQUID CRYSTAL DISPLAY DEVICE

[75] Inventor: Kwang Jo Hwang, Kyoungki-do, Rep. of Korea

[73] Assignee: LG Philips LCD Co., Ltd., Seoul, Rep. of Korea

[21] Appl. No.: 09/215,002

[22] Filed: Dec. 17, 1998

[30] Foreign Application Priority Data

Jun. 13, 1998 [KR] Rep. of Korea ............... 98-22163

[51] Int. Cl.$^7$ .................... H01L 21/00; H01L 21/302
[52] U.S. Cl. .................... 438/30; 438/158; 438/159; 438/720
[58] Field of Search .................... 438/30, 158, 159, 438/162, 635, 701, 720, 713, 727

[56] References Cited

U.S. PATENT DOCUMENTS

| 5,153,754 | 10/1992 | Whetten | 359/59 |
|---|---|---|---|
| 5,498,573 | 3/1996 | Whetten | 437/192 |
| 5,549,212 | 8/1996 | kanoh et al. | 216/24 |
| 5,610,082 | 3/1997 | Oh | 437/21 |
| 5,917,564 | 6/1999 | Kim | 349/46 |
| 5,922,125 | 7/1999 | Zhang | 117/9 |
| 5,926,735 | 7/1999 | Yamazaki et al. | 438/635 |
| 5,998,229 | 12/1999 | Lyu et al. | 438/30 |
| 6,004,179 | 12/1999 | Alwan | 445/24 |

*Primary Examiner*—Andrew Tran
*Assistant Examiner*—Michael S. Lebentritt

[57] ABSTRACT

A method of manufacturing an LCD requires only 4 masking while preventing undercutting of a semiconductor layer and includes the steps of etching a passivation layer, an a-Si layer and a gate insulating layer simultaneously by using $CF_4/He$ gas. The flow ratio of the He gas to $CF_4$ gas is preferably about 15% to about 35%.

27 Claims, 8 Drawing Sheets

METHOD FOR MANUFACTURING A LIQUID CRYSTAL DISPLAY DEVICE

BACKGROUND OF THE INVENTION

1. Field of the Invention

The present invention relates to a method of manufacturing a liquid crystal display device (LCD), and more specifically, a method of manufacturing an LCD requiring only 4 mask processes while preventing undercutting of a semiconductor layer.

2. Description of the Background Art

Figure 1:
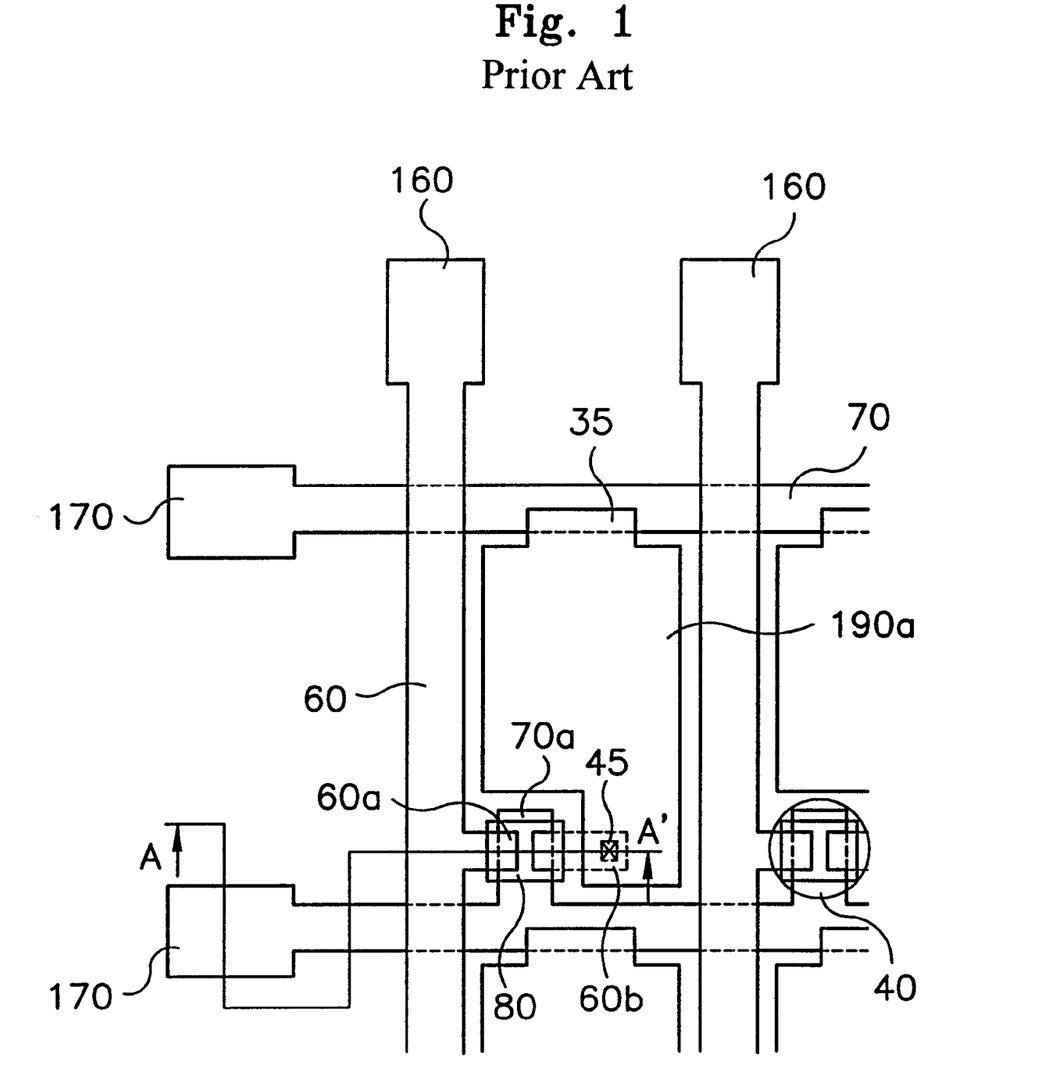
FIG. 1 is a plane view of the conventional liquid crystal display device.

Generally, a conventional liquid crystal display device includes a gate bus line 70 and a data bus line 60 arranged in a matrix array as shown in FIG. 1. The LCD further includes a TFT 40 functioning as a switching element driven by an electrical signal from the gate bus line 70 and the data bus line 60 which is disposed at an intersection portion of the gate bus line 70 and the data bus line 60 and a pixel electrode 190*a* connected to the TFT 40.

The TFT 40 includes a gate electrode 70*a* which is derived from the gate bus line 70, a source electrode 60*a* which is derived from the data bus line 60 and a drain electrode 60*b* which faces the source electrode 60*a*. The gate electrode 70*a* is covered by a gate insulating layer (not shown). A semiconductor layer 80 is disposed over the gate electrode 70*a* on the gate insulating layer. The source electrode 60*a* and the drain electrode 60*b* are disposed at each side of the semiconductor layer. The drain electrode 60*b* is connected to the pixel electrode 190*a* through a contact hole 45 which is formed in the passivation layer (not shown). At the end of the gate bus line 70 and the data bus line 60, a gate pad 170 and a data pad 160 are connected to an output of the driving IC.

The elements are formed by using mask processes involving photo lithography. Each mask process includes the steps of coating a photo resist on a thin layer, patterning the photo resist using a mask by exposing and developing the photo resist, etching the thin layer and removing the remaining photo resist which is remaining on the thin layer. As the number of mask processes increases, the yields for producing acceptable, non-defective LCDs decreases, because each mask process may cause some inferiority in mask alignment, over-etching, under-etching and pin holes.

Therefore, much research and attempts have been made to reduce the mask processes required for manufacturing of LCDs. As a result, the number of mask processes required for forming an LCD has been reduced from 8 mask processes to 6 mask processes, to 5 mask processes and to 4 mask processes.

The present invention relates to a 4 mask process method of manufacturing an LCD. The conventional method related to manufacturing an LCD is explained with reference to FIGS. 2*a*–2*i*.

Figure 2A:
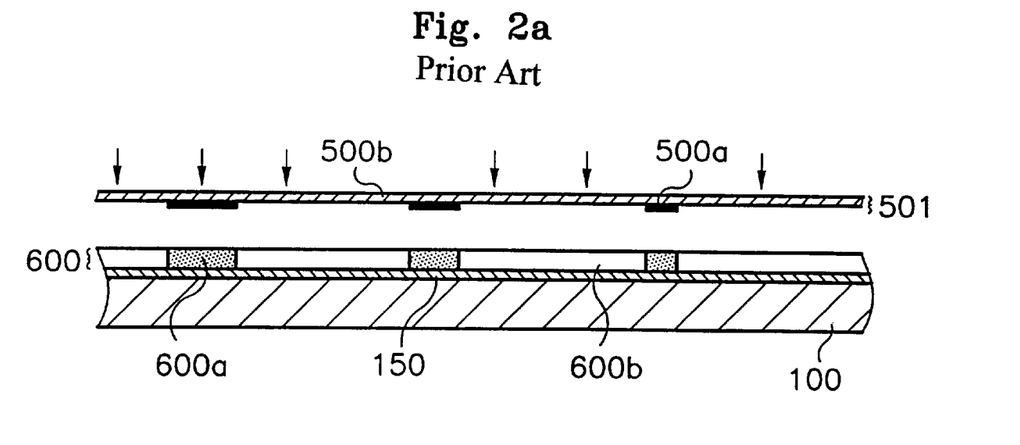
FIGS. 2a–2i are cross-sectional views which illustrate the conventional manufacturing process of the LCD cut along line A—A of FIG. 1.

On a transparent substrate 100, a first metal layer 150 including aluminum (Al), molybdenum (Mo) or chromium (Cr) is deposited. After a photo resist 600 is coated on the first metal layer 150, the photo resist 600 is exposed using a first mask 501 which has a patterning portion 500*a* and an opening portion 500*b* as shown in FIG. 2*a*. If the photo resist 600 is the positive type, then the portion 600*b* which is exposed to the UV light through the opening portion 500*b* of the first mask 501 is changed to be easily removed by the developer and the covered portion 600*a* which is not exposed to the UV light by the patterning portion 500*a* of the first mask 501 is hardened so as not to be removed by the developer.

Figure 2B:
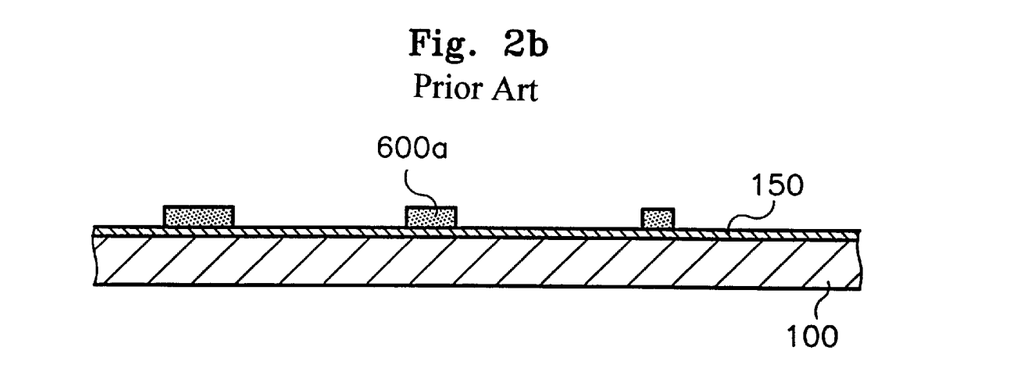

The covered portion 600*a* of photo resist remains on the metal layer 150 and the exposed portion 600*b* is removed by the developer according to the patterning of the first mask 501. After developing, the photo resist is patterned as shown in FIG. 2*b*.

Figure 2C:
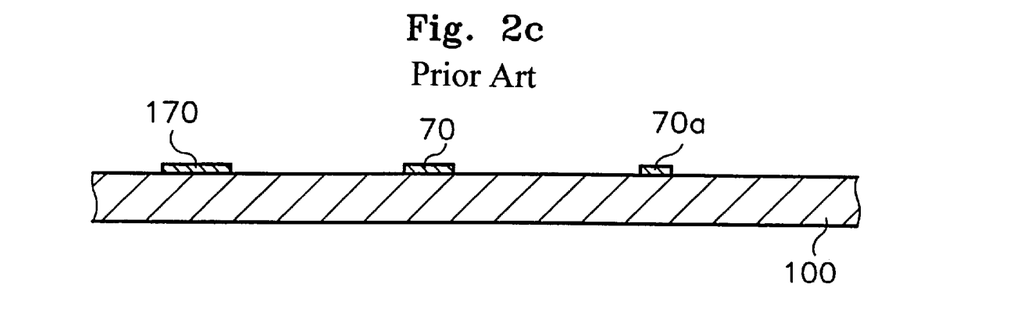

After the patterned (remaining) photo resist 600*a* is hardened by baking, the first metal layer 150 is etched by wet or dry etching method and is stripped by the patterned photo resist 600*a*. Then a gate pad 170, a gate bus line 70 and a gate electrode 70*a* are formed as shown in FIG. 2*c*.

Figure 2D:
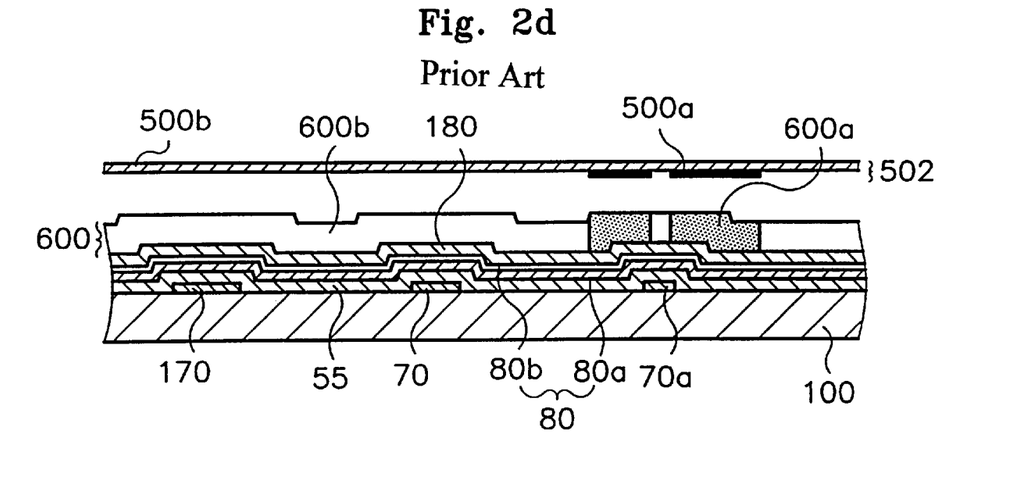

A gate insulating layer 55 including $SiN_x$, $SiO_x$ or BCB (BenzoCycloButene), an intrinsic amorphous silicon (a-Si) layer 80*a*, an n+impurity doped amorphous silicon layer 80*b* and a second metal layer 180 are deposited sequentially. After a photo resist 600 is coated on the second metal layer 180, the photo resist 600 is exposed by using a second mask 502 as shown in FIG. 2*d*.

Figure 2E:
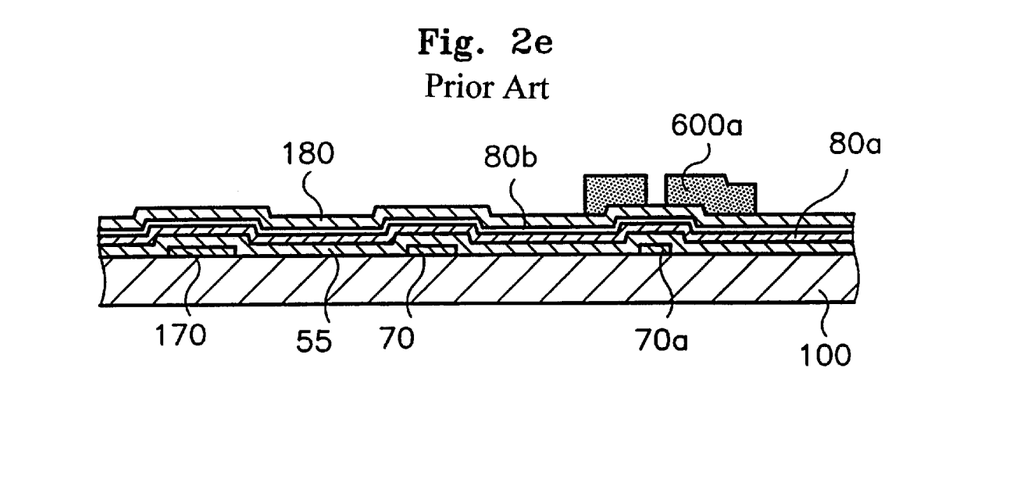

Similar to the exposing step of the first mask 501, the photo resist 600 is exposed and developed by using the second mask 502. Then a pattern 600*a* of the photo resist is formed on the second metal layer 180 as shown in FIG. 2*e*.

Figure 2F:
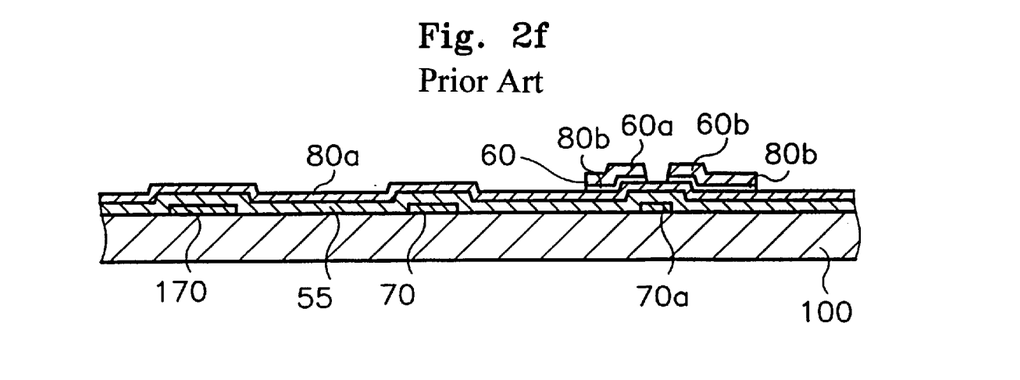

After the patterned (remaining) photo resist 600*a* is hardened by baking, the second metal layer 180 and n+impurity doped a-Si layer 80*b* are etched by wet or dry etching method and strip the patterned photo resist 600*a*. Then, a data bus line 60, a source electrode 60*a* which is derived from the data bus line 60 and a drain electrode 60*b* which faces the source electrode 60*a* are formed. The doped a-Si layer 80*b* is formed to have the same shape as the source materials (the data line 60, the source electrode 60*b* and the drain electrode 60*c*) as shown in FIG. 2*f*. Furthermore, a data pad which is not shown in figures may be formed at the end of the data bus line 60.

Figure 2G:
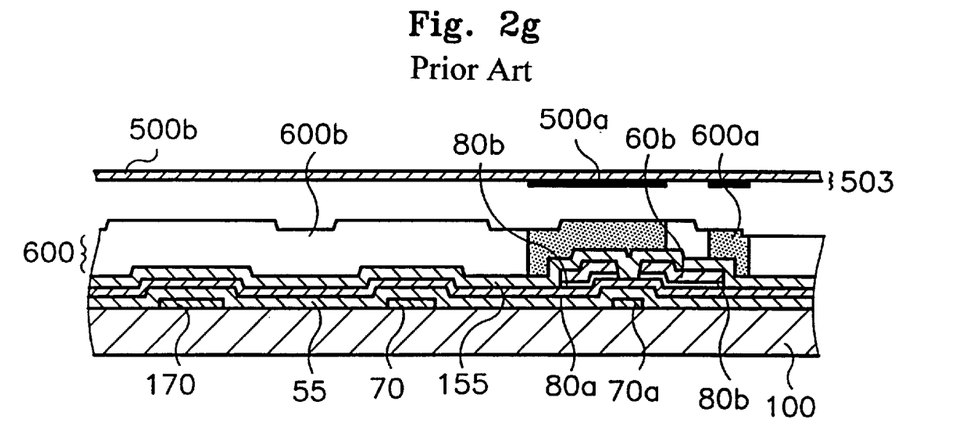

On the substrate 100 having the source materials, a passivation layer 155 which includes an inorganic material such as $SiN_x$ or $SiO_x$ or an organic material such as a BCB is deposited and/or coated. After a photo resist 600 is coated on the passivation layer 155, the photo resist 600 is exposed by using a third mask 503 as shown in FIG. 2*g*.

Figure 2H:
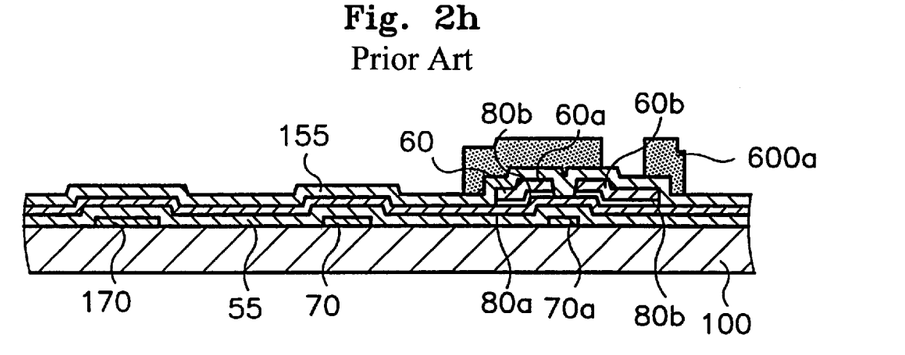

Similar to the exposing step of the first mask 501 and the second mask step 502, the photo resist 600 is exposed and developed by using the third mask 503. Then a pattern 600*a* of the photo resist is formed on the passivation layer 155 as shown in FIG. 2*h*.

Figure 2I:
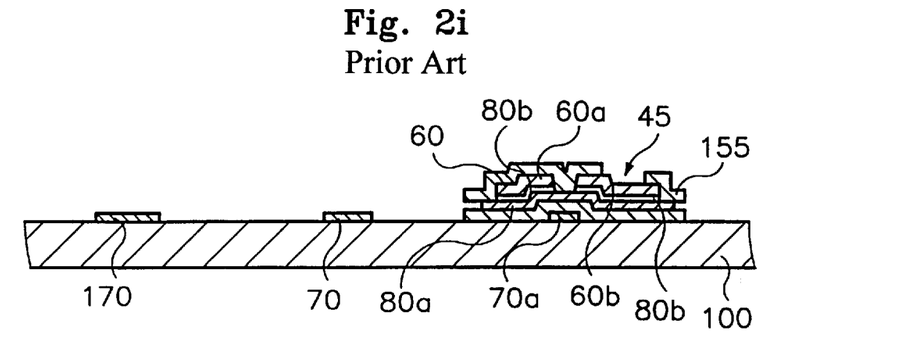

After the patterned (remaining) photo resist 600*a* is hardened by baking, the passivation layer 155, the a-Si layer 80*a* and the gate insulating layer 55 are simultaneously etched by using $SF_6/O_2$ gas and is stripped by the patterned photo resist 600*a*. Then, a TFT is completed and the gate bus line 70 and the gate pad 170 are exposed as shown in FIG. 2*i*. At the same time, some portions of the drain electrode 60*b* are exposed through a contact hole 45. On the passivation layer 155, the a-Si layer 80*a* and the gate insulating layer 55 are patterned and the drain electrode 60*b* is exposed but not etched by the $SF_6/O_2$ gas because the etching rate of the drain electrode 60*b* is much larger than the etching rate of the other layers.

Figure 2J:
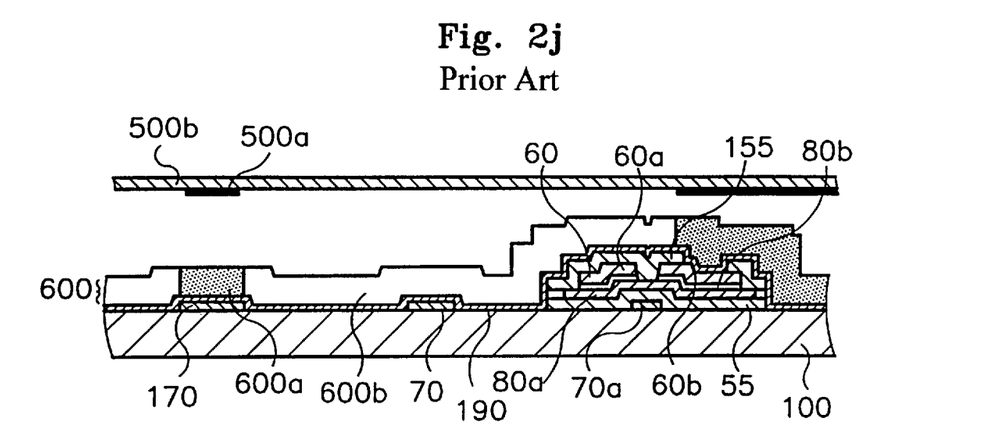

An ITO (Indium Tin Oxide) layer 190 is deposited on the substrate 100 having the TFT. After a photo resist 600 is coated on the ITO layer 190, the photo resist 600 is exposed by using a fourth mask 504 as shown in FIG. 2*j*.

Figure 2K:
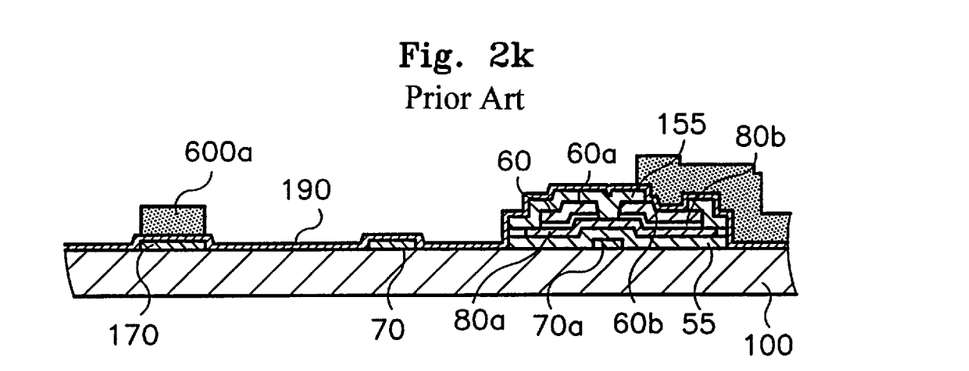

Similar to the exposing step of the third mask 503, the photo resist 600 is exposed and developed by using the fourth mask 504. Then a pattern 600*a* of the photo resist is formed on the ITO layer 190 as shown in FIG. 2*k*.

Figure 2L:
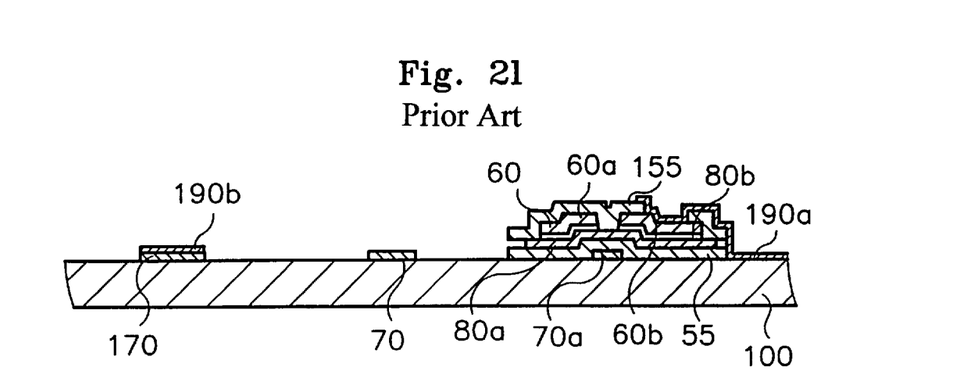

After the patterned (remaining) photo resist 600*a* is hardened by baking, the ITO layer 190 is etched and stripped by the patterned photo resist 600*a*. Then a pixel electrode 190*a* and a gate terminal 190*b* on the gate pad 170 are formed as shown in FIG. 2*i*. At the same time, a data terminal (not shown) is further formed on the data pad 160.

Figure 3:
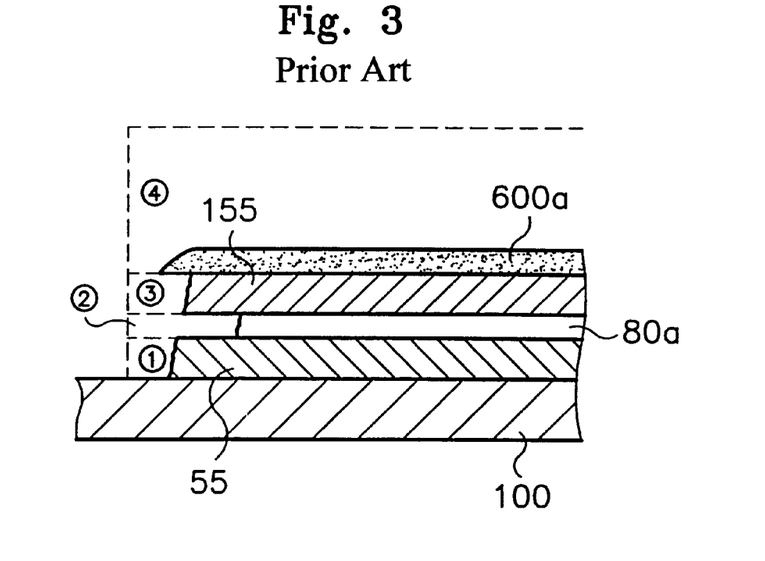
FIG. 3 is a cross-sectional view which illustrates an etched state of the passivation layer and the a-Si layer and the gate insulating layer which are simultaneously etched according to the conventional method.

According to the conventional method as described above, the a-Si 80a is undercut when the passivation layer 155, the a-Si layer 80a and the gate insulating layer 55 are simultaneously etched in the third mask process. The main reason for the undercutting is that the etching rate of the a-Si layer 80a is greater than the etching rates of the passivation layer 155 and the gate insulating layer 55. The side surfaces 1, 2, 3 and 4 of the gate insulating layer 55, the a-Si layer 80a, the passivation layer 155 and the photo resist 600a are also etched by the $SF_6/O_2$ etching gas. Here, the a-Si layer 80a is much more affected and etched than the other layers so that the a-Si layer 80a is over-etched which results in the undercut as shown in FIG. 3. According to the conventional method, the TFT which has the undercut a-Si layer 80a has inferior characteristics and therefore, the quality of the LCD is bad.

SUMMARY OF THE INVENTION

To overcome the problems described above, preferred embodiments of the present invention provide a method of manufacturing an LCD in which a a-Si layer is not undercut when a gate insulating layer, the a-Si layer and a passivation layer are simultaneously etched. Other preferred embodiments of the present invention provide a method of manufacturing an LCD in which the characteristic of the TFT is stable, when four mask processes are used for forming the LCD panel.

To solve the problems described above in the conventional method and to achieve the advantages described in the preceding paragraph, preferred embodiments of the present invention provide a manufacturing method of an LCD including the step of etching a passivation layer, an a-Si layer and a gate insulating layer simultaneously using $CF_4$/He gas. It is preferred that the flow ratio of the He gas to $CF_4$ is about 15% to about 35%.

Another preferred embodiment of the present invention includes steps of forming a gate bus line and a gate electrode by patterning a first metal layer using a first mask; forming a data bus line, a source electrode, a drain electrode and an ohmic contact layer by depositing a gate insulating layer, a first semiconductor layer, a second semiconductor layer and a second metal layer sequentially and patterning the second metal layer and the second semiconductor layer simultaneously using a second mask; forming a switching element and exposing the drain electrode by depositing a passivation layer and patterning the passivation layer, the first semiconductor layer and the gate insulating layer using a third mask wherein $CF_4/O_2$ gas is used as an etching gas; and forming a pixel electrode by depositing and patterning a conductive layer which uses a fourth mask.

BRIEF DESCRIPTION OF THE ATTACHED DRAWINGS

The present invention will become more fully understood from the detailed description provided herein below and the accompanying drawings which are given by a way of illustration and therefore not limited to the present invention only and wherein.

DETAILED DESCRIPTION OF PREFERRED EMBODIMENTS

Referring to the figures, preferred embodiments of the present invention will be explained in detail. FIGS. 4a–4f are cross-sectional views showing a method of manufacturing an LCD panel according to preferred embodiments of the present invention.

A first metal layer is formed on a transparent substrate 100. The first metal layer is patterned by using a first mask pattern to form a gate bus line 70, a gate pad 70b at the end of the gate bus line 70 and a gate electrode 70a which is derived from the gate bus line 70.

A gate insulating layer 55 is deposited on the substrate 100 which has the gate electrode 70a by using an inorganic material such as a SiNx or SiOx. An amorphous silicon (a-Si) layer 80a, an $n^+$ impurity doped amorphous silicon layer 80b and a second metal layer are sequentially deposited thereon. Then, the second metal layer is patterned by using a second mask pattern to form a data bus line 60, a data pad 160 at the end of the data bus line 60, a source electrode 60a which is derived from the data bus line 60 and a drain electrode 60b which faces the source electrode 60a. Using the shape of the data bus line 60, the data pad 160, the source 60a and drain electrode 60b as a mask, the doped a-Si layer 80b is patterned.

Up to this point, the method is same as the conventional method as shown in FIG. 2f.

Figure 4A:
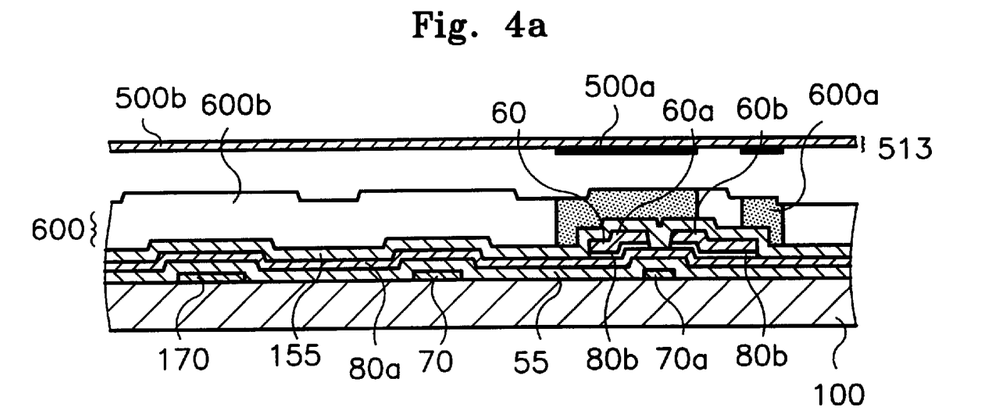
FIGS. 4a–4f are the cross-sectional views which illustrate a manufacturing process of a liquid crystal display according to preferred embodiments of the present invention.

A passivation layer 155 is formed on the substrate having the source electrode 60a and the drain electrode 60b by depositing an inorganic material such as $SiN_x$ or $SiO_x$ and/or coating an organic material such as a BCB (BenzoCycloButene). After a photo resist 600 is coated on the passivation layer 155, the photo resist 600 is exposed using a third mask 513 as shown in FIG. 4a.

Figure 4B:
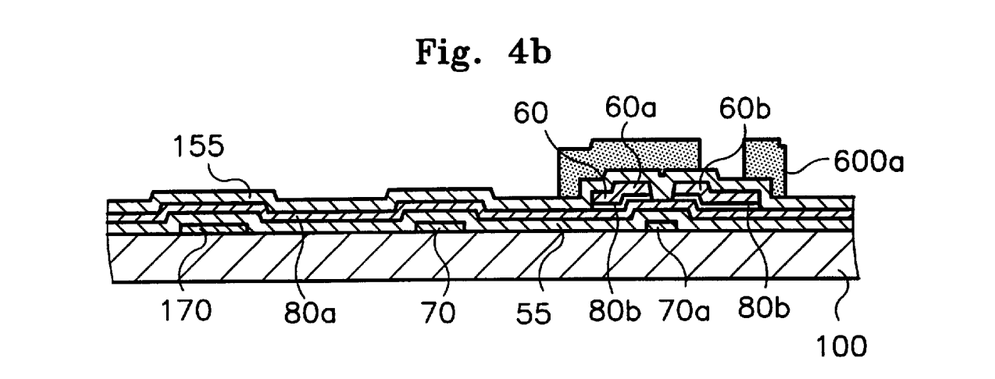

The photo resist 600 is exposed and developed by using the third mask 503, then a pattern 600a of the photo resist is formed on the passivation layer 155 as shown in FIG. 4b.

Figure 4C:
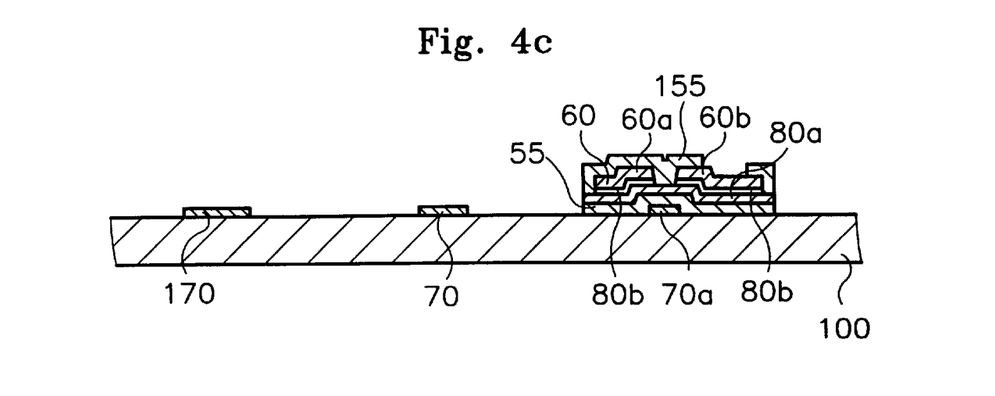

After the patterned (remaining) photo resist 600a is hardened by baking, the passivation layer 155, the a-Si layer 80a and the gate insulating layer 55 are simultaneously etched by using $CF_4$/He gas and are stripped by the patterned photo resist 600a. The flow rate of the He gas to the $CF_4$ gas is preferably about 4:1. As a result, the a-Si layer 80a and the gate insulating layer 55 have the same shape as the a-Si layer 80a. A TFT is completed and the passivation layer 155 covers the source electrode 60a and drain electrode 60b and the a-Si layer 80a is disposed therebetween. The gate bus line 70 and the gate pad 170 are exposed as shown in FIG. 4c. At the same time, some portions of the drain electrode 60b are exposed through a contact hole 45. On the passivation layer 155, the a-Si layer 80a and the gate insulating layer 55 are patterned, the drain electrode 60b is exposed but not etched by the $CF_4$/He gas because the etching rate of the drain electrode 60b is much larger than other layers.

Figure 4D:
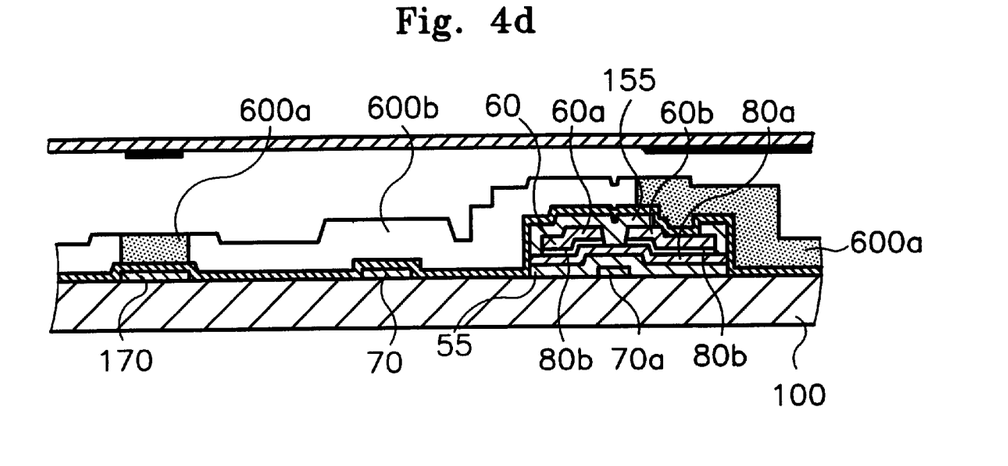

An ITO (Indium Tin Oxide) layer 190 is deposited on the substrate 100 which includes the TFT. After a photo resist 600 is coated on the ITO layer 190, the photo resist 600 is exposed by using a fourth mask 504 as shown in FIG. 4d.

Figure 4E:
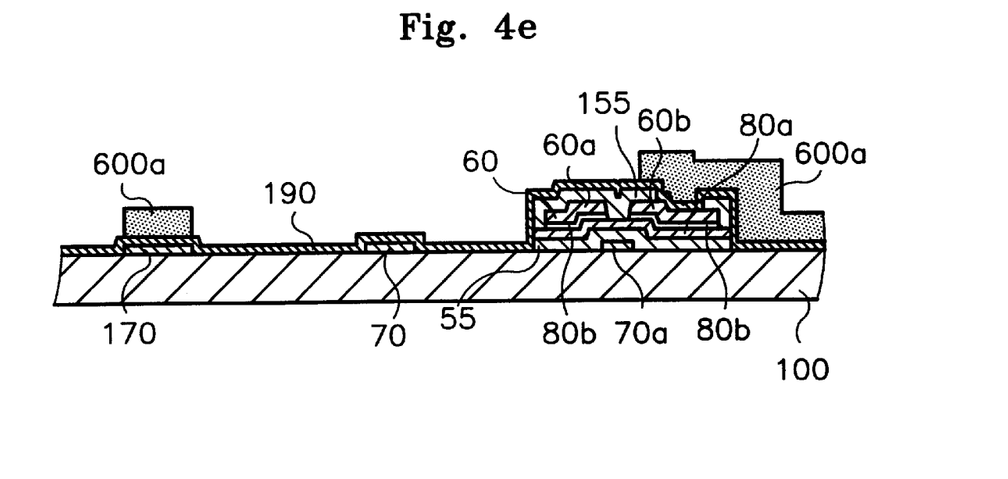

Similar to the exposing step of the third mask 503, the photo resist 600 is exposed and developed by using the fourth mask 504. Then a pattern 600a of the photo resist is formed on the ITO layer 190 as shown in FIG. 4e.

Figure 4F:
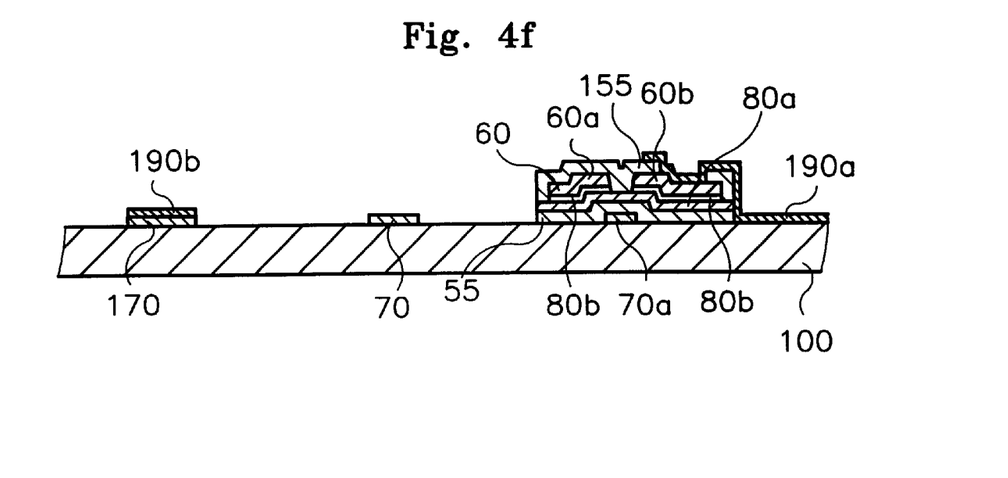

After the patterned (remaining) photo resist 600a is hardened by baking, the ITO layer 190 is etched and is stripped by the patterned photo resist 600a. Then a pixel electrode 190a and a gate terminal 190b on the gate pad 170 are formed as shown in FIG. 4f. At the same time, a data terminal (not shown) is further formed on the data pad 160.

Figure 5:
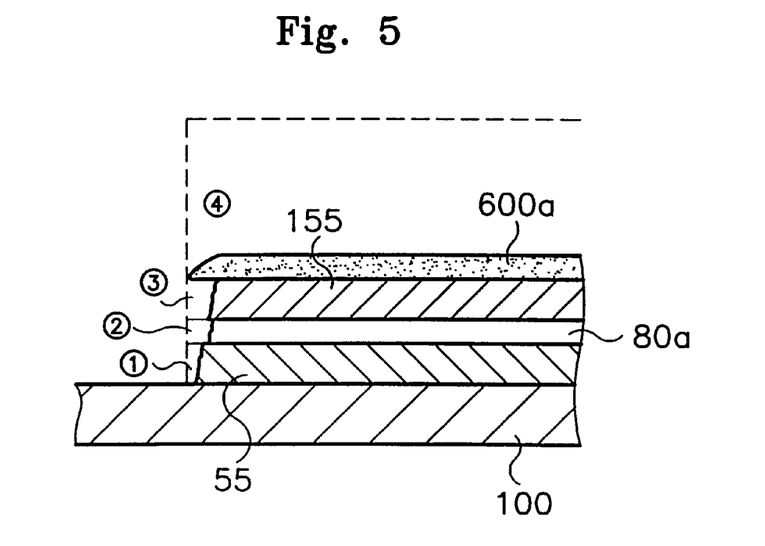
FIG. 5 is a cross-sectional view which illustrates an etched state of a passivation layer, an a-Si layer and a gate insulating layer which are simultaneously etched according to preferred embodiments of the present invention.

When the passivation layer 155, the a-Si layer 80a and the gate insulating layer 55 are simultaneously etched by using $CF_4$/He etching gas, the side surface of the a-Si layer and the gate insulating layer are not undercut. So, the shape of the etched side has a desired shape which is uniformly patterned along the mask pattern as shown in FIG. 5. More specifically, the a-Si layer 80a is not over-etched, because the etching rate of the a-Si layer 80b relative to the $CF_4$/He gas is similar to that of the passivation layer 155 and the gate insulating layer 55.

As described above, preferred embodiments of the present invention provide a method of manufacturing an LCD using only four mask processes wherein a passivation layer, an a-Si layer and a gate insulating layer are simultaneously etched to complete a TFT switching element by using $CF_4$/He as an etching gas, which preferably has a flow ratio of about 4:1. According to preferred embodiments of the present invention, the etching rates of the three layers (the passivation layer, the a-Si layer and the gate insulating layer) are similar to that of the $CF_4$/He etching gas. As a result, the a-Si layer is not undercut when the a-Si layer is exposed to the etching gas during the etching time. Therefore, the a-Si layer which is the channel layer of the TFT is not damaged by the etching gas and the a-Si layer has the originally desired characteristics. Furthermore, the quality of the LCD is not affected and is excellent.

While the invention has been particularly shown and described with reference to preferred embodiments thereof, it will be understood by those skilled in the art that the forgoing and other changes in form and details may be made therein without departing from the spirit of the invention.

What is claimed is:

1. A method of manufacturing a semiconductor device comprising the steps of:
   providing a substrate;
   forming a semiconductor layer on the substrate; and
   etching the semiconductor layer using $CF_4$/He gas.

2. A method according to claim 1, wherein said semiconductor device is a thin film transistor.

3. A method according to claim 1, wherein a flow rate of He gas to $CF_4$ gas is about 15% to about 35%.

4. A method according to claim 1, wherein the semiconductor layer is made of amorphous silicon material.

5. A method of manufacturing a liquid crystal display comprising the steps of:
   providing a substrate;
   forming a first insulating layer on the substrate;
   forming a semiconductor layer on the substrate;
   forming a passivation layer on the substrate; and
   etching at least one of the first insulating layer, the semiconductor layer and the
   passivation layer using $CF_4$/He gas.

6. A method according to claim 5, wherein each of the first insulating layer, the semiconductor layer and the passivation layer is etched using the $CF_4$/He gas.

7. A method according to claim 6, wherein each of the first insulating layer, the semiconductor layer and the passivation layer is etched simultaneously.

8. A method according to claim 5, wherein a flow rate of He gas to $CF_4$ gas is about 15% to about 35%.

9. A method according to claim 5, wherein the semiconductor layer is made of amorphous silicon material.

10. A method according to claim 5, wherein the passivation layer and the gate insulating layer comprise at least one material selected from an organic material and an inorganic material.

11. A method according to claim 10, wherein the inorganic material comprises at least one of $SiN_x$ and $SiO_x$.

12. A method according to claim 10, wherein the organic material comprises benzocyclobutene.

13. A method of manufacturing a liquid crystal display comprising the steps of:
    providing a substrate;
    forming a gate bus line and a gate electrode on the substrate;
    forming a gate insulating layer, a first semiconductor layer, a second semiconductor layer and a metal layer on the substrate;
    patterning the metal layer and the second semiconductor layer;
    forming a passivation layer on the substrate;
    patterning the passivation layer and the first semiconductor layer and the gate insulating layer
    using $CF_4$/He gas.

14. The method according to claim 13, wherein the passivation layer and the first semiconductor layer and the gate insulating layer are patterned simultaneously by using the $CF_4$/He gas.

15. A method according to claim 13, wherein a flow rate of He gas to $CF_4$ gas is about 15% to about 35%.

16. A method according to claim 13, wherein the semiconductor layer is made of amorphous silicon material.

17. A method according to claim 13, wherein the passivation layer and the gate insulating layer comprise at least one material selected from an organic material and an inorganic material.

18. A method according to claim 17, wherein the inorganic material comprises at least one of $SiN_x$ and $SiO_x$.

19. A method according to claim 17, wherein the organic material comprises benzocyclobutene.

20. A method of manufacturing a liquid crystal display comprising the steps of:
    providing a substrate;
    forming a first insulating layer on the substrate;
    forming a semiconductor layer on the substrate;
    forming a passivation layer on the substrate; and
    etching the first insulating layer, the semiconductor layer and the passivation layer using a gas that achieves isotropic etching of each of the first insulating layer, the semiconductor layer and the passivation layer.

21. The method according to claim 20, wherein the gas is $CF_4$/He gas.

22. The method according to claim 20, wherein the passivation layer and the first semiconductor layer and the gate insulating layer are patterned simultaneously by using the gas.

23. A method according to claim 21, wherein a flow rate of He gas to $CF_4$ gas is about 15% to about 35%.

24. A method according to claim 20, wherein the semiconductor layer is made of amorphous silicon material.

25. A method according to claim 20, wherein the passivation layer and the gate insulating layer comprise at least one material selected from an organic material and an inorganic material.

26. A method according to claim 25, wherein the inorganic material comprises at least one of $SiN_x$ and $SiO_x$.

27. A method according to claim 25, wherein the organic material comprises benzocyclobutene.

* * * * *